United States Patent [19]
Jonely et al.

[11] Patent Number: 5,680,077
[45] Date of Patent: Oct. 21, 1997

[54] OSCILLATOR-TRANSMITTER WITH SHARED OUTPUT CIRCUIT

[75] Inventors: Michael B. Jonely, Buffalo Grove; Thomas Fleissner, Lake in the Hills, both of Ill.

[73] Assignee: Motorola Inc., Schaumburg, Ill.

[21] Appl. No.: 662,588

[22] Filed: Jun. 13, 1996

[51] Int. Cl.$^6$ .................................................... H03B 5/36
[52] U.S. Cl. ............................ 331/107 A; 331/74; 455/129
[58] Field of Search ........................... 531/74, 99, 100, 531/114, 116 R, 116 FE, 117 R, 117 FE, 117 D, 108 B, 108 C, 108 DP, 107 A; 455/129

[56] References Cited

U.S. PATENT DOCUMENTS

| | | | |
|---|---|---|---|
| 3,991,388 | 11/1976 | Harshbarger | 331/117 R |
| 4,918,406 | 4/1990 | Baumbach et al. | 331/117 R |
| 5,138,284 | 8/1992 | Yabuki et al. | 331/56 |
| 5,396,195 | 3/1995 | Gabara | 331/117 D X |
| 5,422,605 | 6/1995 | Yang et al. | 331/116 R |
| 5,486,793 | 1/1996 | Hill et al. | 331/56 |
| 5,568,095 | 10/1996 | Hill | 331/107 A X |

OTHER PUBLICATIONS

"Balanced Meissner Oscillator Circuits", Nick Demma, Dec. 1993, *RF Design*, pp. 72–74.

*Primary Examiner*—David Mis
*Attorney, Agent, or Firm*—Nicholas C. Hopman

[57] ABSTRACT

An oscillator-transmitter (100) includes an input tank circuit (101) coupled between a first amplifier (103) and a second amplifier (105) configured in an oscillator arrangement. An output tank circuit (107, 109, 111), for radiating radio-frequency energy, is coupled between outputs (106, 110) of the first and second amplifiers (103, 105). The output tank circuit (107, 109, 111) radiates energy provided by both the first and second amplifiers (103, 105).

24 Claims, 1 Drawing Sheet

OSCILLATOR-TRANSMITTER WITH SHARED OUTPUT CIRCUIT

FIELD OF THE INVENTION

This invention is generally directed to the field of radio frequency oscillator-transmitters, and more particularly to a specific architecture for an oscillator-transmitter.

BACKGROUND OF THE INVENTION

Radio frequency (RF) oscillator-transmitters are constructed using different architectures. In battery operated designs, such as those found in remote-keyless-entry (RKE) oscillator-transmitters, an ever-present design challenge is to output maximum power with minimum power drain on the battery.

One architecture, commonly used in RKE oscillator-transmitters, is based on a Colpitts oscillator configuration. One transistor amplifier Colpitts oscillator designs do not output enough power for a given battery operating voltage for most applications. Two transistor amplifier Colpitts oscillator designs use two separate oscillator circuits, each with its own output tank circuit configured in a common-base configuration. Although the two transistor amplifier designs offer more output power for a given battery operating voltage than the single transistor amplifier designs, this approach is costly and more difficult to manufacture because two separate output tank circuits must be fabricated and tuned. Furthermore, because of the additional components associated with the two separate output tank circuits this approach is less reliable in field use. Additionally, two transistor amplifier common-base configured Colpitts oscillator designs unnecessarily load reactive elements in the oscillator circuit causing a reduced Q which results in a less stable oscillator that generates a less pure sine wave. Corrupted purity is a major performance disadvantage in a radio system because transmitted output power is regulated by authorities to include a measure of purity. Thus, if the transmitted energy is not of a pure sine wave form, then the oscillator output power must be trimmed back so as not to interfere with other radio frequency systems.

What is needed is an oscillator-transmitter design that power efficient, reliable, outputs a relatively pure sine wave, and is also easy to manufacture.

DETAILED DESCRIPTION OF A PREFERRED EMBODIMENT

An oscillator-transmitter includes an input tank circuit coupled between a first amplifier and a second amplifier configured in an oscillator arrangement. An output tank circuit, for radiating radio-frequency energy, is coupled between outputs of the first and second amplifiers. The output tank radiates energy provided by both the first and second amplifiers. Preferably the oscillator-transmitter is operated at 315 MHz. This arrangement is power efficient and has fewer components than prior art two amplifier oscillator circuits that used separate tank circuits coupled to the two amplifiers. Furthermore, with fewer components this design is more reliable. To better understand the details of the present embodiment FIG. 1 will be described next.

Figure 1:
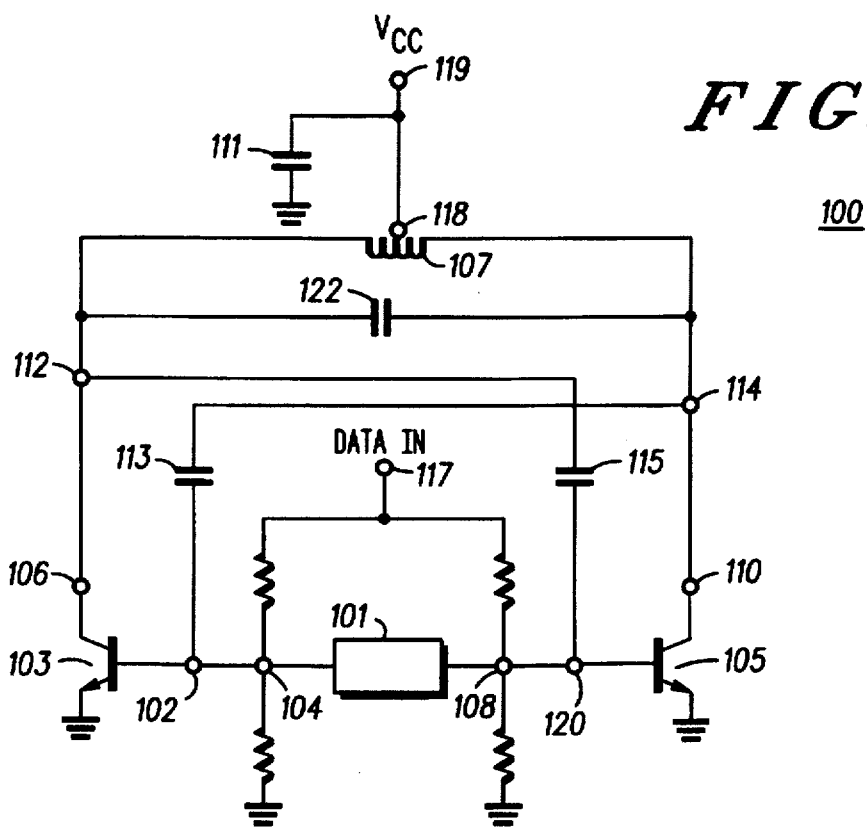
FIG. 1 is a schematic drawing showing a preferred architecture for an oscillator-transmitter in accordance with a preferred embodiment of the invention.

FIG. 1 is a schematic drawing showing a preferred architecture for an oscillator-transmitter in accordance with a preferred embodiment of the invention. An oscillator-transmitter circuit 100 includes a input tank circuit that uses a two terminal surface acoustic wave (SAW) device 101 to determine an initial operating frequency.

A first transistor amplifier 103 has an input 102 coupled to a first terminal 104 of the surface acoustic wave device 101. The first transistor amplifier 103 also has an output terminal 106. A second transistor amplifier 105 has an input 120 coupled to a second terminal 108 of the surface acoustic wave device 101. The second transistor amplifier 105 also has an output terminal 110.

An output tank circuit for radiating energy has a center-tap inductor 107 with a first terminal 112, a second terminal 114, and a center-tap terminal 118. A tank capacitor 122 is coupled between the first terminal 112 and the second terminal 114 of the inductor 107. The center-tap terminal 118 of the inductor 107 is connected to a direct current type power supply 119. The output terminal 106 of the first transistor amplifier 103 is coupled to the first terminal 112, and, the output terminal 110 of the second transistor amplifier 105 is coupled to the second terminal 114.

To complete the oscillator-transmitter circuit 100, symmetrical feedback paths, to the common-emitter configured first and second transistor amplifiers 103 and 105, are formed using a first feedback capacitor 113 and a second feedback capacitor 115. Also a DATA IN (data input) terminal 117 provides an input to which modulating data is fed into the oscillator-transmitter circuit 100 to modulate the oscillator-transmitter circuit 100. Preferably, the DATA IN terminal 117 is used to amplitude modulate the energy output of the oscillator-transmitter circuit 100.

Figure 2:
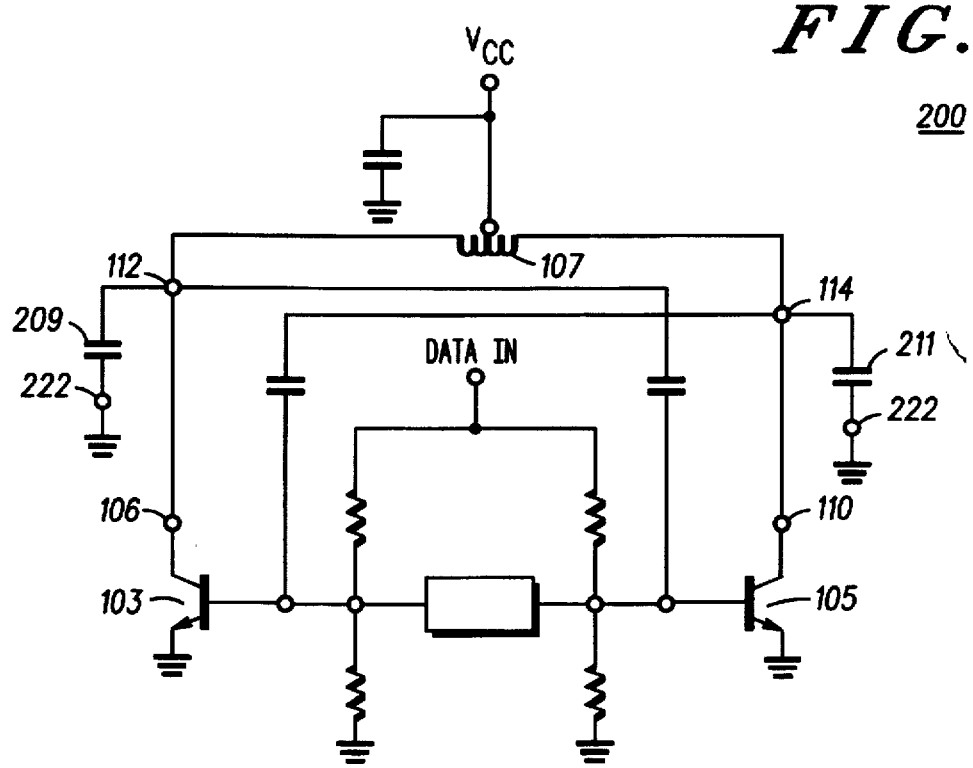
FIG. 2 is a schematic drawing showing another architecture for an oscillator-transmitter in accordance with an alternative embodiment of the invention.

In an alternative embodiment illustrated in FIG. 2, an alternative oscillator-transmitter circuit 200 has an output tank circuit with the center-tap inductor 107 coupled between a first capacitor 109 at the first terminal 112. The inductor 107 is also coupled between a second capacitor 211 at the second terminal 114. The output terminal 106 of the first transistor amplifier 103 is coupled to the first terminal 112 between the first capacitor 209 and the inductor 107. And, the output terminal 110 of the second transistor amplifier 105 is coupled to the second terminal 114 between the second capacitor 211 and the inductor 107. Both capacitors 209 and 211 are directly connected to an alternating current (AC) ground terminal 222.

One advantage of the oscillator-transmitter circuits 100 and 200 is the significant improvement in output power capability over conventional single transistor Colpitts oscillator configurations. The reason for this is that the signal present at terminals 106 and 110 have a voltage of approximately the same amplitude but are out of phase by 180 degrees when measured relative to circuit ground 222. Since these signals are active across the output tank circuit (107 and 122), and are out of phase by 180 degrees the voltage across the output tank circuit (107 and 122) is effectively doubled to six volts in a three volt battery powered circuit and therefore the output power emitted through the output tank circuit (107 and 122) is much higher than in the prior art single transistor Colpitts oscillator configuration.

Another advantage of the oscillator-transmitter circuits 100 and 200 compared to conventional two transistor common-base configured Colpitts oscillators relates to transmitted power purity and oscillator stability. Since the transistor amplifiers in the present oscillator-transmitter circuits 100 and 200 are configured in a common-emitter configuration, loading of the output tank circuit (107 and 122) is significantly less than in the common-base configuration. This reduced loading results in a higher Q for the output tank circuits and also in generation of a purer sine wave. Additionally, the collector-base capacitive feedback used in the oscillator-transmitter circuits 100 and 200 is better than the arrangement necessary in a common-base design because it also presents a lesser load to the output tank circuit (107 and 122), resulting in a more stable and pure emission of power.

The oscillator-transmitter circuits 100 and 200 are also more reliable and easier to manufacture than a two transistor amplifier Colpitts oscillator designs that use two separate oscillator circuits each with its own output tank circuit, because there are fewer components to assemble and fail.

What is claimed is:

1. An oscillator-transmitter with a shared output circuit comprising:

an output tank circuit radiating energy comprising an inductor with a first terminal, a second terminal, and a center-tap terminal, and a tank capacitor coupled between the first terminal and the second terminal of the inductor;

a first amplifier with an input tank circuit wherein an output of the first amplifier is coupled to the first terminal of the output tank circuit; and a second amplifier with an input tank circuit wherein an output of the second amplifier is coupled to the second terminal of the output tank circuit.

2. An oscillator-transmitter in accordance with claim 1 wherein the input tank circuit comprises a surface acoustic wave device.

3. An oscillator-transmitter in accordance with claim 1 further comprising:

a direct current type power supply for supplying operative power to the oscillator-transmitter; and wherein the center-tap terminal of the inductor of the output tank circuit is connected to the direct current type power supply.

4. An oscillator-transmitter in accordance with claim 1 further comprising a data input terminal coupled to both the first and second amplifiers.

5. An oscillator-transmitter in accordance with claim 1 wherein both the first and second amplifiers are comprised of transistors configured in a common-emitter arrangement.

6. An oscillator-transmitter in accordance with claim 1 wherein the input of the first amplifier is coupled to the output of the second amplifier, and the input of the second amplifier is coupled to the output of the first amplifier.

7. An oscillator-transmitter in accordance with claim 6 wherein the coupling between the input of the first amplifier and the output of the second amplifier comprises a feedback capacitor, and the coupling between the input of the second amplifier and the output of the first amplifier comprises another feedback capacitor.

8. An oscillator-transmitter with a shared output circuit comprising:

an alternating current ground terminal;

an output tank circuit radiating energy comprising an inductor with a first terminal, a second terminal, and a center-tap terminal, a first capacitor coupled between the first terminal and the alternating current ground terminal, and a second capacitor coupled between the second terminal and the alternating current ground terminal;

a first amplifier with an input tank circuit wherein an output of the first amplifier is coupled to the first terminal of the output tank circuit; and a second amplifier with an input tank circuit wherein an output of the second amplifier is coupled to the second terminal of the output tank circuit.

9. An oscillator-transmitter in accordance with claim 8 wherein the input tank circuit comprises a surface acoustic wave device.

10. An oscillator-transmitter in accordance with claim 9 further comprising:

a direct current type power supply for supplying operative power to the oscillator-transmitter; and wherein the center-tap terminal of the inductor of the output tank circuit is connected to the direct current type power supply.

11. An oscillator-transmitter in accordance with claim 10 further comprising a data input terminal coupled to both the first and second amplifiers.

12. An oscillator-transmitter in accordance with claim 11 wherein the input of the first amplifier is coupled to the output of the second amplifier, and the input of the second amplifier is coupled to the output of the first amplifier.

13. An oscillator-transmitter in accordance with claim 12 wherein the coupling between the input of the first amplifier and the output of the second amplifier comprises a feedback capacitor, and the coupling between the input of the second amplifier and the output of the first amplifier comprises another feedback capacitor.

14. An oscillator-transmitter in accordance with claim 13 wherein both the first and second amplifiers are comprised of transistors configured in a common-emitter arrangement.

15. A radio frequency oscillator-transmitter with a shared output circuit comprising:

a two terminal surface acoustic wave device with a first and second terminal;

an output tank circuit radiating energy comprising an inductor with a first terminal, a second terminal, and a center-tap terminal, and a tank capacitor connected between the first terminal and the second terminal of the inductor;

a first transistor amplifier having an input connected to the first terminal of the surface acoustic wave device and an output, wherein the output of the first transistor amplifier is connected to the first terminal of the output tank circuit; and a second transistor amplifier having an input connected to the second terminal of the surface acoustic wave device and an output, wherein the output of the second transistor amplifier is connected to the second terminal of the output tank circuit.

16. An oscillator-transmitter in accordance with claim 15 further comprising:

a direct current type power supply for supplying operative power to the oscillator-transmitter; and wherein the center-tap terminal of the inductor of the output tank circuit is connected to the direct current type power supply.

17. An oscillator-transmitter in accordance with claim 16 further comprising a data input terminal coupled to the inputs of both the first and second transistor amplifiers.

18. An oscillator-transmitter in accordance with claim 17 wherein both the first and second transistor amplifiers are comprised of transistors configured in a common-emitter arrangement.

19. An oscillator-transmitter in accordance with claim 18 wherein the input of the first transistor amplifier is connected to the output of the second transistor amplifier via a first feedback capacitor, and the input of the second transistor amplifier is connected to the output of the first transistor amplifier via a second feedback capacitor.

20. An oscillator-transmitter with a shared output circuit comprising:

a two terminal surface acoustic wave device with a first and second terminal;

an alternating current ground terminal;

an output tank circuit radiating energy comprising an inductor with a first terminal, a second terminal, and a center-tap terminal, a first capacitor coupled between the first terminal and the alternating current ground terminal, and a second capacitor coupled between the second terminal and the alternating current ground terminal;

a first transistor amplifier having an input connected to the first terminal of the surface acoustic wave device and an output, wherein the output of the first transistor amplifier is connected to the first terminal of the output tank circuit; and a second transistor amplifier having an input connected to the second terminal of the surface acoustic wave device and an output, wherein the output of the second transistor amplifier is connected to the second terminal of the output tank circuit.

21. An oscillator-transmitter in accordance with claim 20 further comprising:

a direct current type power supply for supplying operative power to the oscillator-transmitter; and wherein the center-tap terminal of the inductor of the output tank circuit is connected to the direct current type power supply.

22. An oscillator-transmitter in accordance with claim 21 further comprising a data input terminal coupled to the inputs of both the first and second transistor amplifiers.

23. An oscillator-transmitter in accordance with claim 22 wherein both the first and second transistor amplifiers are comprised of transistors configured in a common-emitter arrangement.

24. An oscillator-transmitter in accordance with claim 23 wherein the input of the first transistor amplifier is connected to the output of the second transistor amplifier via a first feedback capacitor, and the input of the second transistor amplifier is connected to the output of the first transistor amplifier via a second feedback capacitor.

\* \* \* \* \*